United States Patent [19]
Miller et al.

[11] Patent Number: 5,744,965
[45] Date of Patent: Apr. 28, 1998

[54] SYSTEM FOR CONTINUOUSLY MONITORING THE INTEGRITY OF AN ELECTRICAL CONTACT CONNECTION

[75] Inventors: Gabriel Lorimer Miller, Westfield; Eric Richard Wagner, South Plainfield, both of N.J.

[73] Assignee: Lucent Technologies Inc., Murray Hill, N.J.

[21] Appl. No.: 714,908

[22] Filed: Sep. 17, 1996

[51] Int. Cl.⁶ ..................................................... G01R 31/04
[52] U.S. Cl. ........................... 324/538; 324/522; 340/652
[58] Field of Search ..................................... 324/538, 522, 324/713, 756, 757; 340/635, 643, 646, 664, 651, 652, 653, 512, 513, 514, 515

[56] References Cited

U.S. PATENT DOCUMENTS 3,626,248 12/1971 Bartlett et al. ............................ 324/538
3,705,401 12/1972 Scott ........................................ 340/515
3,906,491 9/1975 Gosswiller et al. ..................... 340/509
4,100,380 7/1978 Gosswiller ............................... 340/652

*Primary Examiner*—Vinh P. Nguyen
*Assistant Examiner*—Diep Do

[57] ABSTRACT

A system for monitoring the integrity of electrical connections includes a transformer with its primary coupled across a dual split contact arrangement and the secondary coupled to both an energy source and a monitoring circuit. When the contact condition is made the secondary impedance reaches a given value which results in a low output indicated by the monitoring circuit. The energy source is preferably a radio frequency oscillator driving the transformer secondary, which is also connected to a monitoring circuit. Preferably, the output from a current reference circuit, coupled to the secondary of the transformer, is coupled to the energy source circuit and the monitoring circuit so as to produce a given output in the monitoring circuit when the contact condition is made.

18 Claims, 4 Drawing Sheets

SYSTEM FOR CONTINUOUSLY MONITORING THE INTEGRITY OF AN ELECTRICAL CONTACT CONNECTION

FIELD OF THE INVENTION

This invention relates to the field of electrical circuits and more particularly to the field of electrical contacts.

BACKGROUND OF THE INVENTION

Numerous situations exist where it is necessary to complete a connection between two components or systems so that a temporary communication channel is established. For example, the land areas of telephone debit cards are read using electrical contacts and similar arrangements can also be found in manufacturing and testing systems where temporary connections provide access to stored and to operational data.

Often, in such arrangements, a proper coupling is assumed based on the operation of a secondary circuit device, such as a relay, semiconductor or a mechanical closure. But the integrity of the actual connection point is not known, and troubles resulting from poor, high ohmic, or open circuits are not detected until trouble occur in "down stream" circuits. Further, systems designed to take a quick look at closures prior to connecting to the interconnecting circuits, fail to detect trouble occurring during the actual transmission of data across such closures.

Accordingly, there is a need to provide a system for continuous monitoring of the integrity of each electrical contact during the entire period of an electrical connection.

SUMMARY OF THE INVENTION

In accordance with the present invention, there is provided a system for continuously monitoring the integrity of a connection made by an electrical contact. The system includes a transformer with its primary coupled across a dual split pin contact arrangement and its secondary coupled to an energy source. A monitoring circuit coupled between the energy source and the transformer primary operates to continuously indicate the integrity of the contact. When a proper contact is made, the reflected secondary impedance produces a predetermined value sensed by the monitoring circuit. In a multiple contact application, multiple transformers are utilized with the secondaries coupled in series so that a single monitoring circuit can verify proper operation of a plurality of dual contact split pin connections.

In a preferred embodiment of the present monitoring system, the energy source is a voltage input circuit which includes an inductor capacitor circuit, tuned to a given frequency, and coupled to the input of an operational amplifier. A current reference circuit, including an operational amplifier, is coupled to the transformer secondary and outputs a current to the voltage input circuit. A current from the current reference circuit in the monitoring circuit is produced continuously when a closed contact condition is detected. The monitoring circuit includes three stages of transistor circuits operating to produce a low output when the closed condition is made. Three stages of transistor circuits are coupled between the transformer secondary and the current reference circuit.

BRIEF DESCRIPTION OF THE DRAWINGS

A more complete understanding of the present invention may be obtained from consideration of the following description in conjunction with the drawings in which.

DETAILED DESCRIPTION

Although the present invention is particularly well suited for monitoring the integrity of electrical connections via split contacts and shall be described with respect to this application, the apparatus disclosed here can be applied to other connection types relying on conductive contacts.

Figure 1:
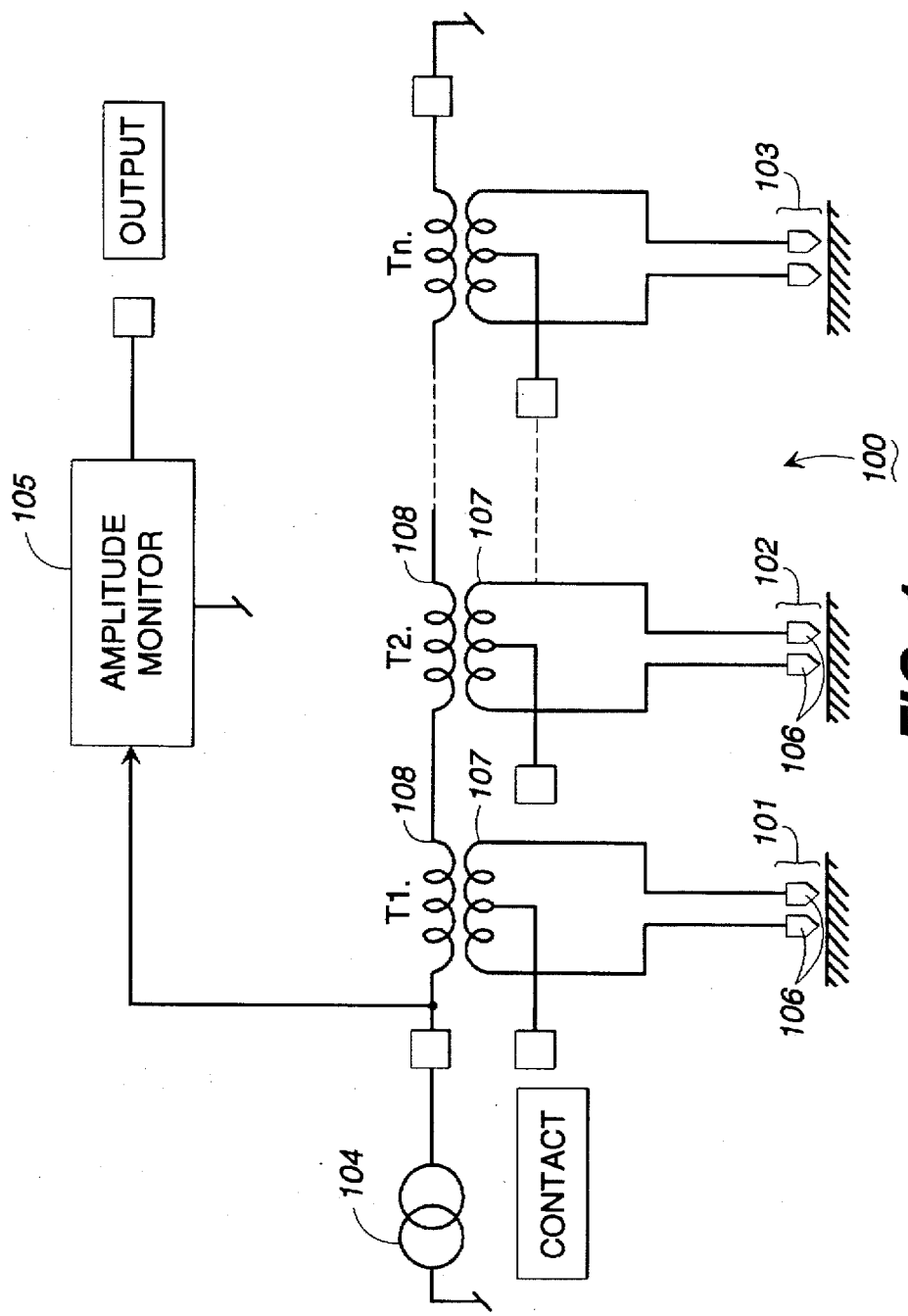
FIG. 1 is a schematic of a current driven test and measurement system in accord with the present invention.

Referring now to FIG. 1 there is shown a schematic of a current driven test and measurement system 100 in accordance with the present invention. A series of electrical contact pairs 101–103 are split into two individually spring loaded contact pins 106. Each pair 101–103 of contact pins 106 are connected to the primary 107 of a small center, tapped transformer, designated T1 to Tn respectively. The transformer secondaries 108 are driven with an alternating current (AC) source 104. Additional circuitry, for example, an amplitude monitor 105 then monitors the looking-in impedance of the transformer secondaries in series. When both pins 106 of a contact pair 101–103 contact a single land area, the corresponding transformer primary 107 is short-circuited, thus, causing the reflected secondary impedance to become extremely low. This contact condition is monitored continuously for all contacts, during all test and measurement periods. This same scheme can be used for all signal, power and ground leads, without restriction.

For the above-described secondary impedance measurement method, it will be noted that the contact testing is absolutely continuous, while all measurements are running. That is, the two halves of the primary are series opposing from the point of view of all signal power and ground currents, which therefore link zero net flux with the transformer core. Consequently the transformer is itself effectively invisible to both the signal and power paths, while the contact is completely floating electrically. Although at high frequencies (tens of MHz) the effects from primary leakage inductance are evident, they can be circumvented by placing two equal small capacitors across the two halves of each transformer primary, if necessary. To the extent that there is any small residual coupling between different contacts, via the transformer primary to secondary capacitances, this can be circumvented by the use of transformers with electrostatic shields. In the event the lowering of the probes onto the contact area creates a high resistance, a small oscillatory mechanical motion for the whole probe head can be employed to in effect automatically "wipe" the contacts until all low impedances are obtained. In fact, a simple wiping action could be an automatic part of the lowering motion of the probe head, as would be understood by a person skilled in the art.

Figure 2:
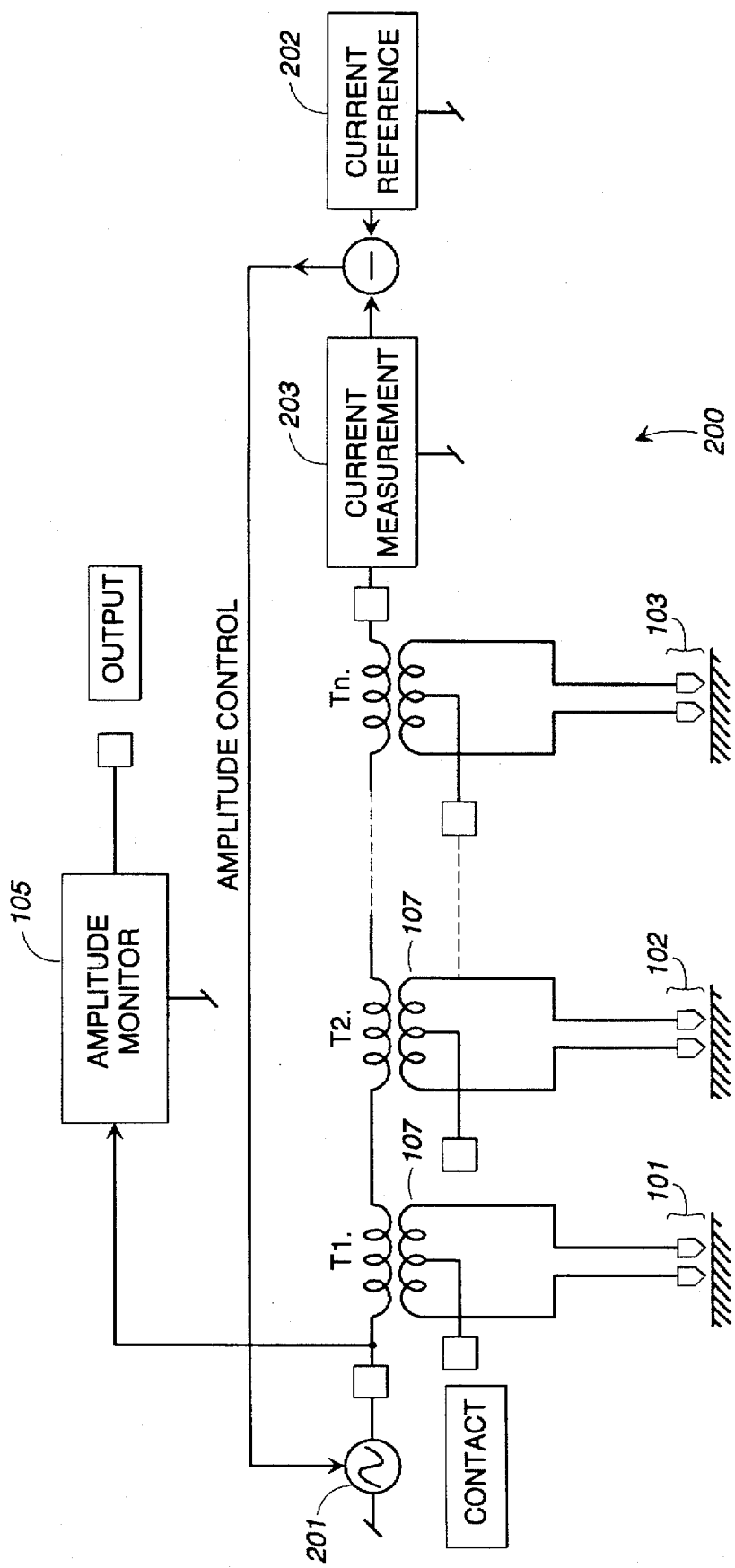
FIG. 2 is a schematic of a voltage driven test and measurement system in accord with the present invention.

There are various alternative embodiments in which the proposed reflected impedance measurement can be made. The scheme shown in FIG. 1 drives all the transformers T1 through Tn in series from a single alternating current source 104 and then monitors the sum of the resulting voltage drops across the secondaries. Although use of a current driven source is viable, there are some advantages with utilizing a voltage to drive the transformers, as shown in FIG. 2. This system 200 of FIG. 2 adjusts the radio frequency (RF) drive voltage amplitude until the current measured at a current measurement device 203 is a certain fixed current as produced from a current reference 202, and the quantity measured by the amplitude monitor 105 is the voltage required to obtain that fixed current. One major advantage of the voltage driven system 200 is that in actual operation all of the transformer primaries and all of the secondaries, T1 to Tn, are simultaneously, in effect, short-circuited. This has the result of minimizing any potential crosstalk effects without requiring the use of electrostatically shielded transformers, although such transformers can always be used, if desired.

Figure 3A:
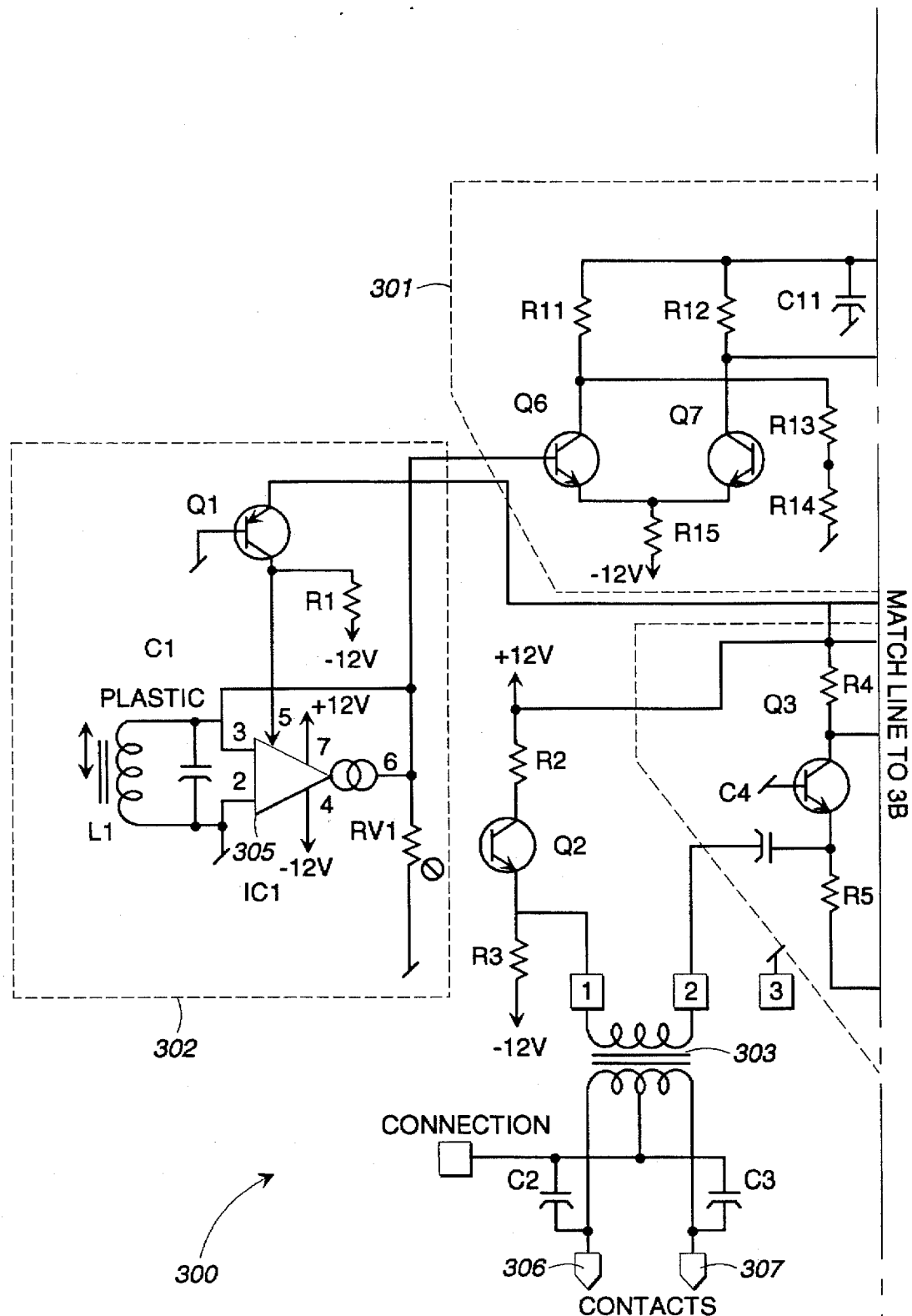
FIG. 3 is a detailed circuit schematic of a preferred embodiment of the present invention.
Figure 3B:
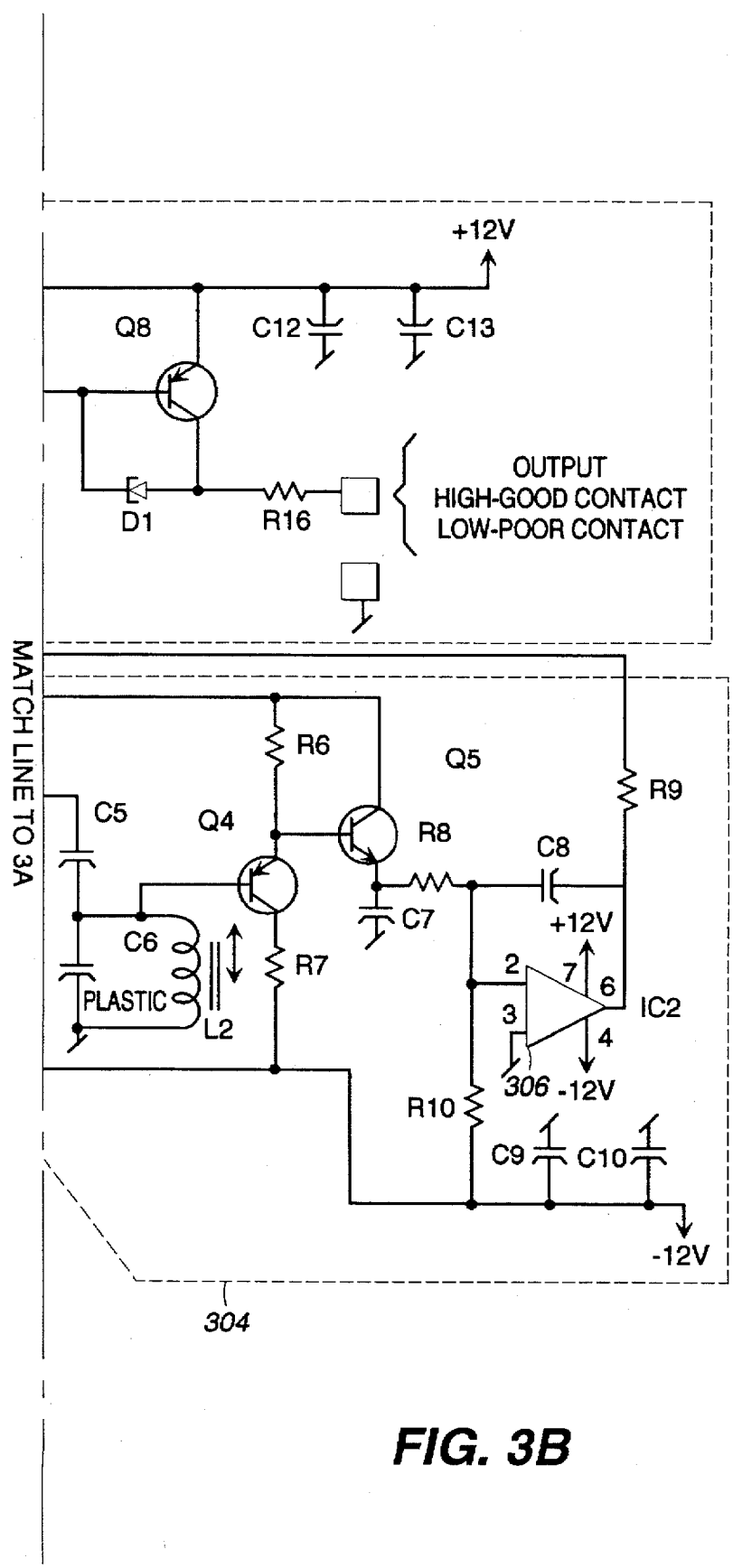

Referring now to FIG. 3, there is shown a detailed circuit schematic of one preferred embodiment 300 of the present invention. The component values and part numbers given in the parts list to follow, i.e., resistance, capacitance, inductance and transistor part numbers, are illustrative only, and may be varied without straying from the scope of the invention disclosed herein. The operational amplifiers utilized are well known in the art. Essentially, an operational amplifier is a high gain device and many suitable amplifiers are available commercially. Although only one transformer 303 is shown rather then several transformers in series, one for each circuit, the system 300 operates as the system 200 in FIG. 2, with a monitoring circuit section 301, a radio frequency drive voltage input section 302, and a current measuring circuit section 304 which includes a current reference circuit. The oscillating input circuit 302 includes an L1C1 resonant circuit coupled to an operational amplifier 305 which is powered by two twelve volt (12V) inputs of opposite polarity. The L1C1 tank circuit is preferably tuned to a frequency of 160 kHz. The operational amplifier 305 is positively biased by an output from the current measurement circuit 304 through a transistor, Q1, coupled to a resistor RI through which a negative twelve volts (–12V) is introduced. The output of the amplifier 305 is coupled to a variable resistor RV1, a feedback loop to the non-inverting (+) input of the amplifier 305 at terminal 3, and to the monitoring section 301 at the base of transistor Q6.

The center tapped 1:1 transformer 303 is preferably one milli-henry (1 mH), and both contact legs 306 and 307 are shunted by capacitors C2 and C3, respectively, to circumvent the effect of leakage inductance at the transformer primary from high frequency oscillation voltages. In a test version of the circuit of FIG. 3, a transformer 303 was utilized having a physical configuration of 1.3 cm square by 7 mm high and a primary to secondary capacitance of –3 Pico-farads (pf) has been utilized.

The current measuring section 304 is tuned to reduce the effect of any spurious signals arising from the applied driving and switching voltages at the contacts. The current measuring section 304 is coupled directly to the transformer 303 secondary leg, labeled "2", through a capacitor C4 to the emitter of transistor Q3 and resistor R5. The collector of Q3 is coupled to a resistor R4 which is in turn coupled to a twelve volt (12V) supply applied through resistor R2 to the collector of transistor Q2. The base of transistor Q2 is tapped to variable resistor RV1, and the emitter is coupled to a negative twelve volt (–12V) supply through resistor R3 and coupled to the transformer 303 secondary leg, labeled "1". The collector of transistor Q3 is coupled through capacitor C5 to an L2C6 tank circuit. Coupled across transistor Q3 and associated resistors R4 and R5, transistor Q4 has its emitter coupled to a resistor R6, its collector coupled to a resistor R7, and its base coupled to the L2C6 tank circuit and capacitor C5. Coupled across resistor R6, are the collector and base of transistor Q5. The emitter of transistor Q5 is coupled to a capacitor C7 and a resistor R8. Coupled from resistors R8 and R7 is resistor R10 which is in turn coupled to capacitors C9 and C10 which are coupled to a negative twelve (12) volt supply. Resistors R10 and R8 are coupled to an inverting (–) input to an operational amplifier 306 with positive and negative biasing voltages of twelve (12) volts. The non-inverting (+) input of the amplifier 306 is preferably tied to ground, as shown, and the output is partially fed-back through a capacitor C8 to the inverting (–) input of the amplifier 306, i.e., a negative feedback loop, and fed through a resistor R9 to the emitter of transistor Q1.

When the system 300 is operated, the demanded constant radio frequency (RF) current flowing from pin-to-pin, i.e., 306 and 307, at each contact is defined by resistors R8 and R10 and is set at a value of 2 milli-amperes, although it could readily be higher if desired. This current provides the RF driving voltage, which itself is monitored, and ensures that the contacts themselves remain electrically quiet.

The monitoring circuit section 301 produces current pulses, at the 160 kHz carrier frequency, whenever the sum total of all the probe contact resistances rises above the preset maximum value. As shown, the output of amplifier 305 is fed as a base input to transistor Q6, which has its emitter coupled to resistors R11 and R13 and its collector coupled to a resistor R15, which in turn is coupled to a negative twelve (12) volt supply. Resistor R15 is coupled to the emitter of transistor Q7, and the junction at resistor R11 and the collector of Q6 is coupled to a voltage divider, made up of resistors R13 and R14, which are in turn coupled to the base of transistor Q7. Resistor R11 is commonly coupled to resistor R12, the emitter of transistor Q8, capacitors C11, C12, and C13, and a twelve (12) volt supply. Resistor R12 is tied to the collector of transistor Q7 and the base of transistor Q8. The emitter of transistor Q8, is fed back through a biasing diode D1 to the base of transistor Q8, and coupled to the output point through a resistor R16. The preferred circuit embodiment 300 of FIG. 3 is preferably fabricated in surface mount technology to occupy an area of only 3 cm by 4 cm, so as to be readily mounted close to any multi-pin probe head for actual high reliability applications.

Description of the operation of the preferred circuit embodiment of FIG. 3 begins at the input where the oscillation amplitude out of the operational amplifier 305, at pin 6, is 5 volts peak-to-peak (p—p) in the absence of a short circuit at the transformer contacts 306 and 307. On shorting the contacts the total oscillation voltage drops to a value such that the voltage across capacitor C7 is 2 volts, which requires an RF voltage drive of only 100 milli-volts at the base of transistor Q2 base. It should be noted that the emitter output impedance of transistor Q2 is 4 ohms, as is the emitter input impedance of transistor Q3. Consequently, even with the variable resistor RV1 set for maximum amplitude, the 0.2 Volt threshold of the transistors Q6 and Q7 in the current discriminator portion is not reached, and therefore, no output pulses are observed. Of course the discriminator threshold can readily be raised by increasing the resistance of R14, but for small numbers of contacts with appropriate transformers, this should not be required.

In a final test of the effect of transients in the circuit of FIG. 3, the "connection" point, at leg "1" of the transformer secondary was driven with 10 volt pulses of 0.1 micro seconds rise time at a 5 MHz repetition rate. Consistent with design expectations, no system disturbance was observed since the winding-to-winding capacitance of the transformer is only 3 pf while the capacitance of C6 is 10,000 pf. This provides an attenuation of a factor of 3000, while at the same time the 160 kHz signal of interest across the L2-C6 tank is 4 volts pp. An extremely high degree of independence from signals at the contacts was observed. The same is true for contact-to-contact crosstalk since both ends of the transformer strings are in effect at ground while the winding to winding coupling capacitances are extremely small.

The following parts lists is illustrative of exemplary component values used in conjunction with the embodiment shown in FIG. 2. Different component values and other components may also be substituted as would be understood by a person skilled in the art.

Component List

R1 10K
R2 100
R3 2.7K
R4 1K
R5 2.7K
R6 4.7K
R7 100
R8 22K
R9 8.2K
R10 120K
R11 4.7K
R12 2.2K
R13 4.7K
R14 220
R15 10K
R16 4.7K
RV1 2.2K
C1 10nf
C2 1nf
C3 1nf
C4 0.1uf
C5 10nf
C6 10nf
C7 1nf
C8 01uf
C9 47uf
C10 0.1uf
C11 0.1uf
C12 47uf
C13 0.1uf
D1 ZC2800
L1 100uh
L2 100uh
Q1 2N3906
Q2 2N3904
Q3 2N3904
Q4 2N3906
Q5 2N3904
Q6 2N3904
Q7 2N3904
Q8 2N3906
1C1 LM3080
1C2 LF351

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A monitoring system for continuously monitoring the integrity of an electrical connection comprising:

a set of dual contact split pins having a first split pin and a second split pin, said set of dual contact split pins providing said electrical connection;

a transformer having a primary winding and secondary winding, said primary winding having an intermediate tap, a first primary end, and a second primary end, said secondary winding having a first secondary end and a second secondary end, said first split pin being electrically coupled to said first primary end of said primary winding, said second split pin being electrically coupled to said second primary end of said primary winding, said intermediate tap being electrically coupled to an unmonitored circuit connection;

an energy source electrically coupled to said first secondary end of said secondary winding, said second secondary end of said secondary winding electrically coupled to complete a circuit path from said energy source; and a monitoring device electrically coupled to said first secondary end of said secondary winding, said monitoring device developing a first output value if impedance at said electrical connection is less than a threshold value, said monitoring device developing a second output value if impedance at said electrical connection is greater than said threshold value.

2. The system in accordance with claim 1, wherein said energy source is an alternating current source.

3. The system in accordance with claim 1, wherein said monitoring device is an amplitude monitor for indicating that said electrical connection is made when a measured reflected secondary impedance across said transformer is less than a predetermined value.

4. the system in accordance with claim 1, wherein said energy source is an alternating voltage source.

5. The system in accordance with claim 4, further including a given current reference coupled to said secondary winding with a polarity opposing the current generated in said secondary winding.

6. The system in accordance with claim 5, wherein said monitoring device measures said given current reference whenever closure of a monitored electrical connection is made.

7. The system in accordance with claim 1 wherein said electrical connection is an electrical contact having a first contact pad and a second contact pad, said electrical contact operable to provide a mechanical oscillatory motion between said first pad and said second pad, said mechanical oscillatory motion creating friction between said first pad and said second pad, said oscillatory motion freeing said first pad and said second pad from debris and ensuring a low impedance between said first contact pad and said second contact pad when said electrical connection is closed.

8. A system for continuously monitoring the integrity of an electrical connection comprising:

a set of dual contact split pins having a first pin and a second pin, said set of dual contact split pins comprising said electrical connection;

a transformer having a primary winding and secondary winding, said primary winding having an intermediate tap, a first primary end, and a second primary end, said secondary winding having a first secondary end and a second secondary end, said first pin being electrically connected to said first primary end of said primary winding, said second pin being electrically connected to said second primary end of said primary winding, said intermediate tap being electrically connected to an unmonitored circuit connection;

an alternating current (AC) voltage driving circuit operating at a predetermined reference frequency, an output terminal of said voltage driving circuit electrically connected to said first secondary end of said secondary winding, said second secondary end of said secondary winding electrically coupled to complete a circuit path for said voltage driving circuit; and a voltage monitoring circuit electrically coupled to said first secondary end of said secondary winding, said voltage monitoring device developing a first output value if a secondary reflected impedance value of said secondary winding causes developed voltage at said first secondary end of said secondary winding to reach a threshold value, said voltage monitoring device developing a second output value if said secondary reflected impedance value of said secondary winding causes developed voltage at said first secondary end of said secondary winding to remain under said threshold value.

9. The system in accordance with claim 8, further including a first capacitor and a second capacitor, said first capacitor providing a capacitive shunt from said first pin to an unmonitored circuit connection, said second capacitor providing a capacitive shunt from said second pin to said unmonitored circuit connection said first and second capacitors provided so as to minimize the effects of inductance leakage at said primary winding of said transformer.

10. The system in accordance with claim 8, wherein said voltage driving circuit includes an inductive/capacitive tank circuit, said inductive/capacitive tank circuit tuned to said predetermined reference frequency, said inductive/capacitive tank circuit incorporated within said voltage driving circuit so as to cause an output signal of said voltage driving circuit to oscillate at said predetermined reference frequency.

11. The system in accordance with claim 10 further comprising a current reference circuit to provide a feedback signal to said voltage driving circuit, said feedback signal utilized to bias said voltage driving circuit.

12. The system in accordance with claim 10, wherein an output from said voltage driving circuit is coupled to an input to said voltage driving circuit, said output coupled to said monitoring circuit and coupled to a variable resistor.

13. The system in accordance with claim 8, wherein said secondary winding of said transformer is coupled to said voltage driving circuit through a transistor circuit coupled to a variable resistor.

14. The system in accordance with claim 8, wherein said monitoring circuit includes three cascaded stages of transistor circuits biased by a voltage supply.

15. The system in accordance with claim 8 further comprising a current reference circuit, wherein said current reference circuit includes an operational amplifier having inputs coupled to said secondary winding and an output coupled to said voltage driving circuit.

16. The system in accordance with claim 15, wherein said current reference circuit is coupled to three stages of transistor circuits which are coupled to said secondary winding and coupled to said operational amplifier.

17. The system in accordance with claim 16, wherein said three stages of transistor circuits includes an inductive/capacitive tank circuit tuned to a predetermined reference frequency.

18. A monitoring system for continuously monitoring the integrity of a plurality of electrical connections comprising:

a plurality of sets of dual contact split pins, each of said plurality of sets of dual contact split pins having a first split pin and a second split pin, each of said plurality of sets of dual contact split pins respectively comprising each of said plurality of electrical connections;

a plurality of transformers, each of said plurality of transformers respectively associated with each of said plurality of electrical connections, each of said plurality of transformers having a primary winding and a secondary winding, said primary winding having an intermediate tap, a first primary end, and a second primary end, said secondary winding having a first secondary end and a second secondary end, said secondary winding of each of said plurality of transformers electrically connected in series, said first split pin of each of said plurality of sets of dual contact split pins electrically connected to each respective said first primary end associated with each of said plurality of transformers, said second split pin of each of said plurality of sets of dual contact split pins electrically connected to each respective said second primary end associated with each of said plurality of transformers, said intermediate tap respectively associated with said primary winding of each of said plurality of transformers electrically connected to a plurality of unmonitored circuit connections;

an energy source electrically coupled to said first secondary end of a first secondary winding, said second secondary end of a last secondary winding electrically configured to provide a complete circuit path for said energy source after providing energy though said secondary winding of each of said plurality of transformers electrically connected in series; and a monitoring device electrically connected to said first secondary end of said first secondary winding, said monitoring device operable to develop a first output value if a sum of accumulated reflective impedance from said secondary winding of each of said plurality of transformers is less than threshold value, said monitoring device operable to develop a second output value if a sum of accumulated reflective impedance from said secondary winding of each of said plurality of transformers is greater than said threshold value.

* * * * *

UNITED STATES PATENT AND TRADEMARK OFFICE
CERTIFICATE OF CORRECTION

PATENT NO.  : 5,744,965
DATED       : April 28, 1998
INVENTOR(S) : Gabriel Lorimer Miller, et al It is certified that error appears in the above-identified patent and that said Letters Patent is hereby corrected as shown below:

Title page, item [56], under

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 3 | 3 | 0 | 3 | 4 | 1 | 8 | 2/7/67 | Rose | | | |
| | | 3 | 7 | 4 | 6 | 8 | 8 | 0 | 7/17/73 | Iritani et al. | | | |
| | | 4 | 6 | 4 | 9 | 8 | 2 | 1 | 3/17/87 | Marshal et al. | | | |
| | | 5 | 0 | 3 | 9 | 8 | 8 | 7 | 8/13/91 | Brahms et al. | | | |
| | | | | | | | | | | | | | |

FOREIGN PATENT OR PUBLISHED FOREIGN PATENT APPLICATION

| | | DOCUMENT NUMBER | | | | | | | PUBLICATION DATE | COUNTRY OR PATENT OFFICE | CLASS | SUBCLASS | TRANSLATION | |
|---|---|---|---|---|---|---|---|---|---|---|---|---|---|---|
| | | | | | | | | | | | | | YES | NO |
| | | 5 | 6 | 0 | 8 | 9 | 5 | 62 | 6/12/81 | Japan | | | | |
| | | | | | | | | | | | | | | |

Signed and Sealed this

Ninth Day of February, 1999

Attest:

Attesting Officer

*Acting Commissioner of Patents and Trademarks*